United States Patent [19]

Freeman

[11] Patent Number: 4,810,673

[45] Date of Patent: Mar. 7, 1989

[54] OXIDE DEPOSITION METHOD

[75] Inventor: Dean W. Freeman, Garland, Tex.

[73] Assignee: Texas Instruments Incorporated, Dallas, Tex.

[21] Appl. No.: 908,835

[22] Filed: Sep. 18, 1986

[51] Int. Cl.$^4$ ............... C23C 16/40; C23C 16/46; B05D 5/12

[52] U.S. Cl. ............... 437/239; 437/235; 437/238; 437/243; 437/244; 148/DIG. 27; 148/DIG. 118; 427/255.3

[58] Field of Search ............... 437/238, 239, 243, 244; 148/DIG. 27, DIG. 118; 427/255.2, 255.3; 357/23.6

[56] References Cited

U.S. PATENT DOCUMENTS

| | | | |
|---|---|---|---|
| 4,002,512 | 1/1977 | Lim | 437/238 |
| 4,196,232 | 4/1980 | Schnable et al. | 427/255.3 |
| 4,239,811 | 12/1980 | Kemlage | 437/238 |
| 4,371,587 | 2/1983 | Peters | 427/255.3 |
| 4,683,486 | 7/1987 | Chatterjee | 357/23.6 |

FOREIGN PATENT DOCUMENTS

| | | | |
|---|---|---|---|
| 221497B | 2/1986 | Czechoslovakia . | |
| 215731 | 12/1984 | Japan . | |
| 6618216 | 6/1967 | Netherlands | 427/255.3 |

OTHER PUBLICATIONS

Mattson, "CVD Films for Interlayer Dielectrics", Solid State Technology, Jan. 23, 1980, pp. 60–64.
Pan et al, "Properties of Thin LPCVD Silicon Oxynitride Films", J. of Electronic Matls., vol. 14, No. 5, 1985, pp. 617–632.
Baliga and Ghandhi, "Growth of Silica and Phosphosilicate Films", J. Appl. Phys., vol. 44, No. 3, Mar. 1973, pp. 990–994.
Kuiper et al., "Deposition and Composition of Silicon Oxynitride Films", J. Vac. Sci. Technol. B1(1), Jan.–Mar. 1983, pp. 62–66.
Brown and Kamins, "An Analysis of LPCVD System Parameters for Polysilicon, Silicon Nitride and Silicon Dioxide Deposition", Solid State Technology, Jul. 22, 1979, pp. 51–57.
Rosler, "Low Pressure CVD Production Processes for Poly, Nitride and Oxide", Solid State Technology, Apr. 20, 1977, pp. 63–70.
Habraken et al., "Hydrogen in Low-Pressure Chemical-Vapor-Deposited Silicon (oxy) Nitride Films", J. Appl. Phys., vol. 59, No. 2, Jan. 15, 1986, pp. 447–453.
Kern and Rosler, "Advances in Deposition Processes for Passivation Films", J. Vac. Sci. Technol., vol. 14, No. 5, Sep./Oct. 1977, pp. 1082–1099.
Watanabe et al., "The Properties of LPCVD $SiO_2$ Film Deposit by $SiH_2Cl_2$ and $N_2O$ Mixtures", J. Electrochem. Soc., vol. 128, No. 12, pp. 2630–2635.
Zvanut et al., "Electrical Properties of Silicon Dioxide Films Fabricated at 700° C.", J. of Electronic Matls., vol. 14, No. 3, 1985, pp. 343–366.
Maxwell, Jr. and Knolle, "Densification of SIPOS", J. Electrochem. Soc., vol. 128, No. 3, Mar. 1981, pp. 576–580.

Primary Examiner—Brian F. Hearn
Assistant Examiner—Mary Wilczewski
Attorney, Agent, or Firm—Larry C. Schroeder; Leo N. Heiting; Melvin Sharp

[57] ABSTRACT

Silicon dioxide is deposited by low pressure chemical vapor deposition (LPCVD) from dichlorosilane plus nitrous oxide, using a larger concentration of dichlorosilane than of nitrous oxide.

22 Claims, 1 Drawing Sheet

OXIDE DEPOSITION METHOD

BACKGROUND AND SUMMARY OF THE INVENTION

The present invention relates to integrated circuits and to methods for manufacturing them.

Where a high quality thin dielectric is required in integrated circuits based on silicon chemistry, it is general practice today to grow rather than deposit the oxide. Thin gate dielectrics (250 Å or thinner) are being used with great frequency in today's VLSI circuits. However, the continued scaling of lateral circuit dimensions also tends to require thinner dielectrics, and very thin grown oxides are susceptible to increased defect density if process conditions are not exactly correct.

One particular limitation of the conventional growth methods arises when it is desired to form a thin oxide over heavily doped silicon, and particularly over heavily boron doped single crystal silicon. (Oxides grown over heavily boron-doped silicon will tend to contain a large enough fraction of boron to significantly degrade their electrical characteristics.)

This is a particular problem in applications where it is important to minimize the voltage dependence of the capacitance. This is commonly done by maximizing the dopant concentration in a single crystal semiconductor, in order to reduce the depletion width (and the variation of depletion width with applied potential) beneath the insulator. However, as noted, this can run into difficulties when the underlying semiconductor is heavily boron doped.

Silicon nitride can be grown or deposited as a thin dielectric, but is also subject to reliability problems, including pinholes, leakage, and instability in the CV (capacitance as a function of voltage) characteristics. See P. Pan et al., 14 J. *Electronic Materials* 617 (1985), which is hereby incorporated by reference. Grown oxynitrides have also been tested as thin gate dielectrics, and show some promise; but in some cases it is desirable to have an oxide dielectric, due to subsequent processing conditions.

Thus, it has been recognized that it would be desirable to have a method for depositing thin oxide films with quality close to that of grown oxide films. However, no such process has heretofore been successfully developed. Many chemistries for depositing silicon oxides have been reported in the literature, including tetraethylorthosilane (TEOS), silane plus nitrous oxide, dichlorosilane plus nitrous oxide, and silane plus oxygen. Some processes for depositing silicon oxides by CVD have been found to be unsuitable for contamination reasons. For example, chemical vapor deposition of oxides from tetraethylorthosilane (TEOS) tends to provide oxides which contain levels of mobile ion impurities (such as sodium) which are high enough to preclude their use as thin oxides for capacitors.

Among the deposition chemistries previously explored was dichlorosilane ($SiH_2Cl_2$. also abbreviated as DCS) plus nitrous oxide, using [$N_2O$]/[DCS] ratios of 1 or greater. See W. A. Brown and T. I. Kamins. 22 Solid State Technology 51 (1979): R. S. Rosler, 20 Solid State Technology 63 (1977): K. Watanabe et al., 128 J. Electrochemical Soc. 2630 (1981): and M. E. Zvanut et al., 14 J. Electronic Materials 343 (1985); all of which are hereby incorporated by reference.

The present invention teaches that, when using this chemistry, a [$N_2O$]/[DCS] ratio of less than one should be used, instead of the ratios (typically 4 or 5, and always greater than 1) taught by the known prior art.

As is well known in the art, deposited films normally need high temperature anneals to achieve optimal electrical characteristics (i.e. if the electrical characteristics are to approach those of a thermal gate oxide). (See the Zvanut et al. article cited above.) The present invention provides results in the as-deposited state which are superior to those available in as-deposited films in the prior art, but it must be understood that these as-deposited characteristics will be further improved by the subsequent annealing step.

Oxides deposited according to the present invention provide electrical characteristics very close to those of grown oxides. In particular, oxides deposited according to the present invention provide higher and more uniform breakdown voltages than are possible with previously known methods for chemical vapor deposition of oxides. Moreover, oxides deposited according to the present invention tend to have a very low concentration of mobile ion impurities, so that their electrical characteristics are appropriately stable. Moreover, oxides deposited according to the present invention tend to have a low defect density and a low density of pinholes. Moreover, oxides deposited according to the present invention tend to have a high breakdown voltage. Moreover, oxides deposited according to the present invention tend to have good conformality (substantially better than that of many grown oxides).

Thus, one advantage of the present invention is that it provides a method whereby a deposited oxide can be used in any location where grown oxide is normally used.

A further advantage of the present invention is that it permits use of deposited oxides in processing stages where grown oxides would normally have been required, and thus reduces the integral $\sqrt{Dt}$ to which the structure being fabricated is exposed.

A further advantage of the present invention is that it provides a method for formation of very high quality thin oxides which is relatively insensitive to the composition of the underlying structure. For example, the present invention can be used to deposit a dielectric which will serve, in some locations in the circuit, as the gate oxide for transistors whose gates are in the second polysilicon level, and, in other parts of the circuit, will serve as the capacitor dielectric for capacitors whose lower plate is on the first polysilicon level and whose upper plate is on the second polysilicon level.

A further advantage of the present invention is that it permits fabrication of trench capacitors with consistent leakage and breakdown characteristics and with capacitance nearly as high as that permitted by the area of the cell with as thin a dielectric as permitted by leakage and breakdown constraints.

A further advantage of the present invention is that it permits fabrication of capacitors over heavily p-type semiconductor substrates. A further advantage of the present invention is that it permits fabrication of dielectrics having quality comparable to that of a grown oxide on silicon, over substrates which are not silicon at all. For example, the present invention can be used to provide high quality capacitors over III-V semiconductors (or over II-VI compounds, or over Group IV semiconductors other than pure silicon, or over ferroelectrics, or over any other material which can withstand the deposition temperatures required).

A further embodiment of the present invention uses the high quality oxide deposition process described to form sidewall oxide filaments next to MOS gates. A further advantage of this class of embodiments of the present invention is that the gate sidewall oxide thus formed has a very low density of contaminant species.

A further embodiment of the present invention uses the high quality oxide deposition process described to form sidewall oxide passivation on the floating gate structures of a floating-gate memory transistor. A further advantage of this class of embodiments of the present invention is that the floating gate is passivated with less loss of electrically effective area due to bird's-beaking, and with less integrated $\sqrt{Dt}$, than would be required for passifying this sidewall by oxidation.

In general, the present invention teaches that high quality silicon oxides can be chemical vapor deposited using a source gas mixture which includes a halogenated silane component plus an oxygen source, wherein the atomic ratio of silicon to oxygen in the feed gases is greater than one.

Nitrous oxide is preferable to other oxygen sources since it is a relatively mild oxidizer, and thus less likely to release active radicals away from the heated surface and lead to free space nucleation. Similarly, dichlorosilane is preferred to silane or monochlorosilane, since it is a less active reagent. Optionally, trichlorosilane could be substituted for dichlorosilane, although this is at present believed to be less preferable.

A further advantage of the method of the present invention is that, for a given thin film thickness, this thickness can be formed by a chemical vapor deposition according to the present invention more rapidly than it could be grown under the growth conditions required to produce a high quality oxide film.

Another problem with thermal oxidation is that it is not entirely conformal; for example, in growing an oxide on the interior surface of a silicon trench, the oxide will tend to be thinner at the corners of the trench. This is just the opposite of what would be desirable, since the geometrically induced electric field enhancement means that the oxide will be under higher stress at the corners, just where it is thinnest.

A further advantage of the present invention is that the oxide deposited by the methods of the present invention is highly conformal.

Another problem with conventional grown oxide methods arises when the grown oxide is formed on a non-planar surface. In particular, when trench capacitor cells are used (such as in dRAM cells having trench storage capacitors), the oxide interface will necessarily be grown on silicon having more than one orientation. Unfortunately, the rate of oxide growth is sensitive to the crystal orientation of the silicon, and thus the resulting oxide will tend to be thicker in one direction than another; that is, even if the trench itself is perfectly circular in cross section, the uneven oxide thickness deposited will tend to change this to produce more of an oval opening in cross section. This means that if the thinnest part of the oxide is made thick enough to prevent breakdown or excessive leakage, the thicker parts of the oxide will be thick enough to substantially degrade the specific capacitance.

Thus, one object of the present invention is to provide a method for fabricating trench capacitors having thin and high quality dielectric of uniform thickness along the sides of the trench.

A further advantage of the present invention is that passivation of polysilicon sidewalls can be performed efficiently. For example, in the fabrication of EPROMs it is normal to grow a thin oxide layer over the first polysilicon layer, to insulate the sidewalls of the floating gate. However, this oxide growth step can lead to deformation of the polysilicon sidewalls, and this can lead to miscellaneous other problems. Using the present invention, EPROMs can be fabricated using only CVD oxides for sidewall passivation, without the requirement for the growth step. Thus, deformations are not introduced and the resulting filament problems do not occur.

Thus, the present invention enables at least the following advantages, in addition to others mentioned elsewhere:

1. Formation of high-quality films at lower temperature for less time than required for formation of the same equivalent thickness by oxidation.
2. Formation of high-quality oxide films on a partially fabricated integrated circuit while subjecting the partially fabricated structure to less integrated $\sqrt{Dt}$ than would be required for formation of the same equivalent thickness by oxidation.
3. A deposition method which permits a deposited oxide to be used in any location where grown oxide is normally used.
4. A method, for forming high-quality oxides in any desired location, which is relatively insensitive to the composition of the underlying material.
5. Fabrication of capacitors over silicon which is heavily doped with boron.
6. Fabrication of capacitors over p+ silicon.
7. Dielectrics having quality comparable to that of a grown oxide on silicon can be formed over substrates which are not silicon at all.
8. Formation of thin dielectric films with low defect density.
9. Formation of thin dielectric films with low density of pinholes.
10. Formation of thin dielectric films with low mobile-ion density.
11. Formation of thin dielectric films with good uniformity.
12. Formation of thin dielectric films with good conformality.
13. Formation of thin dielectric films with high breakdown voltage.
14. Formation of thin oxide films with low stress.
15. Fabrication of trench capacitors with large capacitance.
16. Fabrication of trench capacitors with consistent leakage and breakdown characteristics and with large capacitance.
17. Fabrication of floating-gate memory cells with minimal time at high temperature required.
18. Formation of high-quality capacitors having heavily boron-doped silicon as the lower plate thereof.
19. Formation of silicon integrated circuits including high-quality capacitors whose capacitance is relatively independent of applied voltage.
20. Fabrication of MOS transistors having gate sidewall oxide filaments with a very low density of contaminants.
21. Passivation of polysilicon sidewalls can be performed efficiently, without inducing geometric distortions.
22. Passivation of floating gate sidewalls with low leakage levels and low geometric distortions.

According to the present invention there is provided: An integrated circuit including trench capacitors, comprising: a substrate: at least one trench in said substrate: a dielectric material lining at least a part of the sidewalls of said trench, said dielectric material consisting essentially of the composition $SiO_xCl_y$, where x is in the range from 1.75 to 1.95 inclusive and y is in the range from 0.01 to 0.04 inclusive; and a conductive material in said trench, said conductive material, said dielectric material, and said substrate defining a capacitor therebetween.

According to the present invention there is also provided: A thin-film dielectric material consisting essentially of the composition $SiO_xCl_y$, where x is in the range from 1.75 to 1.95 inclusive and y is in the range from 0.01 to 0.04 inclusive.

According to the present invention there is also provided: A method for depositing a thin film of silicon oxides, comprising the steps of: providing a substrate on which the thin film of oxides is to be deposited; heating said substrate; passing a gas flow over said substrate, said gas flow including a silicon bearing component and an oxidizer, wherein the atomic ratio of silicon to oxygen in said gas flow is greater than one.

BRIEF DESCRIPTION OF THE DRAWING

The present invention will be described with reference to the accompanying drawing, wherein.

DESCRIPTION OF THE PREFERRED EMBODIMENTS

Figure 1:
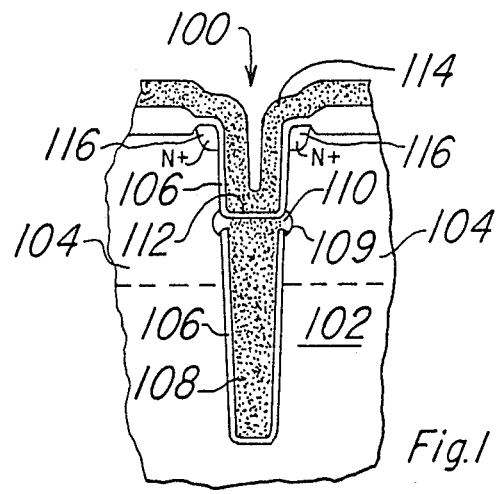
FIG. 1 shows a sample application of the present invention to forming the dielectric for a trench capacitor.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

In a sample embodiment, a test structure is fabricated as follows:

A silicon substrate, containing a partially fabricated integrated circuit on which deposition of a dielectric thin film is desired, is heated to 800 degrees in a furnace tube (which contains a thermal gradient from about 795 C. to about 805 C. over a 40 inch heating zone), and 50 sccm of dichlorosilane and 40 sccm of nitrous oxide are introduced, at a total pressure of 500 milliTorr. Under these conditions, an oxide was deposited at a rate in the range of 10–14 Å per minute. The deposited oxide was found to have a refractive index of 1.45 plus or minus 0.02, indicating a composition close to that of thermal oxide. Rutherford Backscattering spectroscopy indicated that the oxygen to silicon ratio was 1.85, which is close to that (2.0) of thermally grown oxide. (Conventional 4:1 LPCVD oxides also give a O:Si ratio of about 2.) RBS results also showed a small amount of chlorine to be present in the film as deposited.

Gate oxide integrity test results on oxides deposited under these conditions showed improved breakdown characteristics over conventional CVD oxide using a four to one ratio of nitrous oxide to dichlorosilane. The oxide deposited according to the present invention was found to have a much sharper breakdown voltage distribution than the four to one oxide. The four to one oxide has a breakdown voltage distribution which is scattered, which could result in reliability problems if this oxide were used as gate oxide.

Moreover, the thickness of the oxide deposited according to the present invention was found to be more uniform than that of the oxide deposited using an excess of nitrous oxide.

A comparative experiment, designed to compare the characteristics of as-deposited oxide films according to the present invention with those of as-deposited films produced using conventional $N_2O + SiH_2Cl_2$ chemistry and with as-grown thermal oxides, will now be described in great detail.

The oxides were deposited using a Thermco TMX 9001 furnace using 3 zone temperature control. Deposition temperature was 800 degrees. Deposition pressure was 800 microns for the $N_2O/DCS$ ratio of 5 and 400 microns pressure for the $N_2O/DCS$ ratio of 0.8.

Thermal oxides were grown at 950 degrees using $O_2$ with an HCl pretreatment. Thickness and refractive index were measured using a Gertner ellipsometer, and HP computer to calculate the thickness. The slices were prepared in two different methods prior to oxide deposition. When using heavily doped boron substrates, the slices received an ammonium hydroxide. Hydrogen-peroxide treatment followed by hot nitric acid bath immediately preceding the deposition. The non-Boron doped tests had a dummy gate grown and stripped, and the slices were again cleaned as above prior to the deposition.

Metal dot capacitors were built for the collection of electrical data. The time between oxide deposition and Aluminum deposition was kept to less than 1 hour, and was typically only ½ hour. The dots were wet etched and sintered at 450 degrees prior to electrical measurements.

Breakdown data was measured on 0.02 cm² dots. The voltage was stepped from zero volts until all the capacitors had broken down. Breakdown field strength and defect density were calculated. Bias-temperature stress was measured on 0.001 cm² dots using a automated testing system. Flatband voltage and flatband shift were calculated automatically from the CV curve. The CV tests were performed at 300 degrees and at a applied voltage of 0.5 megavolts/cm. Avalanche injection current data was collected using an HP automated system.

Rutherford Back Scattering (RBS) was used to determine stoichiometry, and FTIR spectroscopy was used to measure the Si—O peak. Etch rates of the oxides in a 10:1 unbuffered HF and 10:1 buffered HF are compared. The boron doped substrates were prepared using a solid source Boron Nitride at 900 degrees. The resistivity was in the range of 0.01 $\Omega$-cm.

For simplification the oxide deposited using a $N_2O/DCS$ ratio of 5 will be referred to as 5-ratio oxide, while the oxide deposited using a ratio of 0.8 will be referred to as 0.8-ratio oxide.

TABLE I

Physical Characterization Data

| Growth Method | [N$_2$O]/[DCS] = 5:1 | [N$_2$O]/[DCS] = 0.8:1 | Thermal (O$_2$ + HCl, 950 C.) |
|---|---|---|---|
| Refractive index | 1.43 | 1.45 | 1.46 |
| Etch Rate in HF: | | | |
| 10:1 unbuffered | 14.3 Å/sec | 13.6 Å/sec | 5.1 Å/sec |
| 10:1 buffered | 27.0 Å/sec | 24.3 Å/sec | 13.3 Å/sec |
| O:Si ratio (from RBS) | 2.03 | 1.83 | 2.0 |
| Si—O line (cm$^{-1}$) | 1073 | 1080 | 1080 |
| Stress (Dynes/cm$^2$) | 7.7E8 | >5.5E8 | |

The refractive indices (1.43 for the 5-ratio oxide and 1.45 for the 0.8-ratio oxide) are below that of thermal oxide (1.46), indicating that the density of the films is less than that of thermal oxide. The hydrofluoric acid etch rate data (shown in Table I) confirms this inference, showing that the 5-ratio oxide etches faster than the 0.8-ratio oxide, and both oxides etch much faster than thermal oxide (as is typical of deposited oxides). The etch rate difference between the 0.8-ratio oxide and the 5-ratio oxide is slight, and is probably due to either the stoichiometric difference between the two oxides or the difference in the Si—O bonding present in the two films. RBS data shows that the 0.8-ratio oxide has an O/Si value of 1.83, indicating that the use of a silicon-rich feed gas ratio causes the oxide to be silicon rich. The 5-ratio oixde has a O/Si value of 2.03, which is equivalent to the thermal oxide O/Si value 2.0. The 5-ratio oxide shows an infrared peak like that of thermal oxide. The 0.8-ratio oxide peak is at 1080 cm$^{-1}$, while the 5-ratio oxide peak is at 1073 cm$^{-1}$. Since the infrared signal in this area is thought to represent the amount of Si—O—Si bonding in the oxide, the shift of the signal indicates that there is probably more Si—O—Si bonding present in the 0.8-ratio oxide than in the 5-ratio oxide. See H. R. Maxwell and W. R. Knolle, 128 J. Electrochemical Soc. 576 (1980), which is hereby incorporated by reference. This difference in bonding could account for the difference in etch rates between the two deposited oxides. Both of the oxides have deposition rates of 10–14 angstroms/minute, which suggests that the deposition mechanism is probably the same for both oxides:

$$SiH_2Cl_2 + 2N_2O \rightarrow SiO_2 + 2HCl + 2N_2.$$

The RBS data also indicates that chlorine is present. The 5-ratio oxide has approximately twice the amount of chlorine (Cl/Si=0.045) as does the 0.8-ratio oxide (Cl/Si=0.029). This data contradicts Watanabe et al. 128 (J. Electrochemical Soc. 2630 (1981)), who determined that the DCS/N$_2$O ratio did not effect the chlorine concentration. This result could be due to the large difference in gas ratios used in this study versus the small range of DCS/N$_2$O ratio used in the Watanabe study. The Watanabe study mentions that there are potential problems if Cl is present in gate oxides, and suggests that pitting could have serious effects on the device performance, that the chlorine may adversely affect the overlying polysilicon, and that the chlorine might possibly lead to cracking the oxide film. However, these teachings away from the present invention rely on speculation to a large extent. Experimental tests of the present invention have shown that the stress in the deposited oxide films is very small. For a 1000 Å film the 5-ratio oxide value is 7.6E8 dynes/cm$^2$ tensile, but for the 0.8-ratio oxide the stress is below 5.5E8 dynes/cm$^2$. (For comparison, the stress of a grown film of this thickness would typically be in the neighborhood of 1E9 dynes/cm$^2$ tensile.) Moreover, some of the favorable results found using the present invention may be due to a mechanism where the presence of Cl provides a gettering agent for mobile ions and metal contamination, thus improving the reliability of the deposited oxides over thermal oxides.

Figure 3:
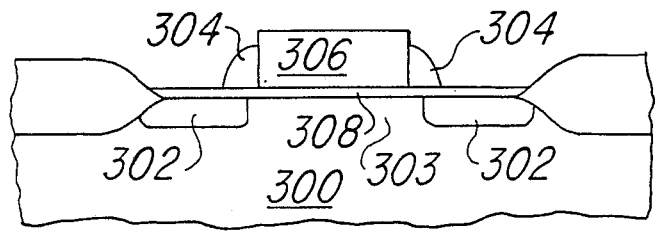
FIG. 3 shows a sample embodiment of the present invention in the formation of an insulated-gate transistor.

The breakdown data of the various tests and oxide thicknesses are shown in Table 2. The field strength was calculated using the mean of the breakdown data divided by a value for oxide thickness calculated from capacitance measurements. The defect density calculations used the value determined by the bend in the curve of the comparison of breakdown voltage verses the normal probability plot. (The bend which indicates the extent of the primary breakdown distribution is illustrated in FIG. 3 of the Maxwell and Knolle paper at 128 J. Electrochemical Soc. 576 (1980)). The equation used for defect density calculations is $$D = -\frac{\ln Y_p}{A},$$

where $Y_p$ is the percent probability where the bend on the plot occurs and A is the area of the metal dot.

TABLE II

Field Strength and Defect Density of Deposited Oxides

| Oxide Type | Thickness Å | Field Strength MV/cm | Defect Density cm$^{-2}$ |
|---|---|---|---|
| test 3503 | | | |
| thermal | 168 | 8.87 | 0 |
| thermal | 172 | 8.43 | 4.2 |
| 0.8-ratio | 163 | 8.40 | 5.8 |
| 0.8-ratio | 162 | 8.46 | 3.1 |
| 5.0-ratio | 165 | 8.30 | 8.7 |
| 5.0-ratio | 169 | 8.20 | 10.5 |
| test 3007 | | | |
| 0.8-ratio* | 205 | 9.22 | 6.4 |
| 5.0-ratio* | 136 | 6.25 | 34.6 |
| 0.8-ratio+ | 205 | 9.27 | 4.7 |
| 0.8-ratio+ | 205 | 9.02 | 11.6 |
| 0.8-ratio+ | 205 | 9.02 | 12.4 |
| 5.0-ratio+ | 136 | 5.88 | 57 |
| 5.0-ratio+ | 136 | 5.74 | 16.4 |
| test 3069 | | | |
| 0.8-ratio+ | 86 | 7.09 | 2.0 |
| 0.8-ratio+ | 86 | 7.56 | 11.2 |
| 0.8-ratio* | 180 | 9.44 | 3.1 |
| 0.8-ratio+ | 180 | 9.17 | 14.4 |
| 0.8-ratio* | 541 | 7.02 | 0 |
| 0.8-ratio+ | 541 | 7.76 | 0 |
| test 2919 | | | |
| 0.8-ratio+ | 350 | 8.29 | 2.6 |
| 0.8-ratio+ | 350 | 8.00 | .3 |
| 0.8-ratio+ | 350 | 8.57 | 0 |
| 5.0-ratio+ | 480 | 8.33 | 0 |
| 5.0-ratio+ | 480 | 7.92 | 1.0 |

Wafers marked with * are lightly doped: wafers marked with + are heavily doped with boron.

The data for tests 3503 and 3007 indicate that the field strength for the 0.8-ratio oxide is slightly higher than the 5-ratio oxide. This trend is observed in test 2919 but is not as significant as is seen in 3007. The thermal oxide in 3503 shows only a slightly higher field strength than 0.8-ratio oxide.

The defect density data follows the same trend as does the field strength for tests 3503 and 3007, which have oxide thicknesses of less than 250 Å. However for the thicker oxide tests the defect data is very close to being the same for both the 0.8-ratio oxide and the 5-ratio oxide. Again the thermal oxide has lower defect levels than either of the deposited oxides. The tests using a heavily doped boron substrate display the same trends as do the oxides deposited on undoped substrate. The defect density is higher than one would expect for these tests. Test 3069, a split between the heavily doped substrate and a lightly doped substrate, show that the heavily doped substrate defect density is much higher than the lightly doped samples. This could be an indication that the additional processing of the heavily doped substrate could have contaminated or damaged the silicon surface prior to oxide deposition or growth. The higher field strength and the lower defect density levels indicate that the 0.8-ratio oxide is superior in breakdown characteristics to the 5-ratio oxide. This is an indication that it might be beneficial to have a slightly silicon rich deposited oxide to provide breakdown characteristics similar to those of a thermal oxide. In addition a high temperature anneal prior to metal deposition may have provided the necessary defect annealing to achieve breakdown characteristics as good or better than a thermally grown oxide.

TABLE III

Flatband Voltage and Flatband Shift

| oxide type | Thickness Å | Flatband Volts | Flatband shift Volts |
|---|---|---|---|
| test 3503 | | | |
| thermal ox | 168 | −.72 | −.004 |
| thermal ox | 172 | −.72 | −.002 |
| 0.8-ratio | 163 | −.86 | −.012 |
| 0.8-ratio | 162 | −.84 | −.003 |
| 5.0-ratio | 165 | −.82 | −.08 |
| 5.0-ratio | 169 | −.82 | −.039 |
| test 3007 | | | |
| 0.8-ratio | 206 | −.99 | +.010 |
| 5.0-ratio | 136 | −.88 | +.015 |
| test 3069 | | | |
| 0.8-ratio | 86 | −.79 | +.009 |
| 0.8-ratio | 180 | −.92 | +.012 |
| 0.8-ratio | 541 | −.87 | +.021 |
| test 3603 | | | |
| thermal | 158 | −.68 | −.002 |
| thermal | 136 | −.69 | −.005 |
| 0.8-ratio | 78 | −.55 | −.005 |
| 0.8-ratio | 78 | −.55 | −.012 |
| 5.0-ratio | 98 | −.72 | −.002 |
| 5.0-ratio | 98 | −.73 | +.011 |

Table III shows flatband voltage and flatband voltage shift. There are some interesting differences between the four data sets in this table. Tests 3503 and 3603 both had a dummy gate grown and stripped prior to the oxides being grown or deposited. Tests 3007 and 3069 were processed using a traditional prediffusion clean. The tests with a dummy gate show negative flatband shifts which is considered typical. The tests without a dummy gate show a positive shift indicative of electron traps being present in the film. Since the only difference between these tests is the pre-furnace cleanup step, the traps are most likely to be at the oxide-silicon interface rather than in the bulk of the film. In test 3503 the 5.0 oxide has a rather significant negative shift of 0.08 volts. Test 3603 does not show as large a shift which suggests a difference in processing or surface contamination, rather than a significant difference in the oxide characteristics. In general the data shows that the flatband shift is small, and about equal for both of the deposited oxides. The mobile ion levels were all below 2E10 $cm^{-2}$, indicating that the oxides were very clean. Typically the deposited oxides had lower mobile ion values than the grown oxides. This may be due to chlorine-related gettering of any ions that had been present.

The avalanche injection testing showed a flatband shift for the thermal oxide of +0.02 volts at a fluence of 1E18 $cm^{-2}$, and almost +4 volts for the 5.0 oxide. The data indicates that the deposited oxides have a large number of electron traps present, thus making the as-deposited oxides unacceptable as a gate oxide in the as-deposited state. (The 0.8-rato oxide had even a large number of traps than the 5.0 oxide and could not be successfully tested.) For many applications, these traps would have to be annealed out with high temperature processing. (They are apparently due to fixed charges as opposed to surface states.)

The dielectric constant of the films was calculated from the equation, $$C = \frac{A\epsilon_r\epsilon_0}{w},$$

where C is capacitance, A is the dot capacitor area, $\epsilon_0$ is the permittivity of vacuum, $\epsilon_r$ is the dielectric constant of the film, and w is the oxide thickness measured by an ellipsometer. The thermal oxide had a dielectric constant of 3.8, the 5.0 oxide dielectric constant was 4.2 and the 0.8-ratio dielectric constant was 3.9.

The dielectric constant of an oxide is typically considered a measure of the silicon content of the film. However, in the present case, this interpretation is disproved by the RBS data and the the avalanche injection data, which show that the 0.8-ratio is richer in silicon than the 5-ratio oxide, but the 0.8-ratio oxide has a smaller dielectric constant (closer to that of the thermal oxide) than the 5-ratio oxide does. The clue to interpreting the difference in dielectric constants is found in the infrared data. As mentioned before the infrared data indicates the Si—O bonding in the 5.0 oxide is weak when compared to the 0.8-ratio oxide. This suggests that there could be more free unbonded silicon present in the 5.0 oxide than in the 0.8-ratio oxide, thus raising the dielectric constant to a level above the 0.8-ratio oxide. That is, the excess silicon in the 0.8-ratio oxide is not unbonded silicon, and the bonding mechanism at work presumably contributes to the desirable electrical characteristics of this oxide.

FIG. 1 shows a sample embodiment of the present invention in the formation of a trench capacitor, wherein a trench 100 (of dimensions, e.g., 1.5 microns square and 8 microns deep) is anisotropically etched into a substrate which includes a p-type epitaxial layer 104 on a heavily doped p-type substrate 102. A silicon-rich oxide 106 is formed on the sidewalls of the trench, e.g. to a thickness of 150 Å by chemical vapor deposition from a gas flow containing 50 sccm of dichlorosilane plus 40 sccm of nitrous oxide. Conductive polysilicon is deposited and etched back, to leave a plug 108 at the bottom of the trench, which (with dielectric 106 and substrate 102) forms a trench capacitor. A buried lateral contact 110 is etched, to connect the plug 108 to a buried diffusion 109, and then an intermediate oxide 112 and gate oxide 106' are formed. The intermediate oxide 112 and gate oxide 106' are then formed by thermal oxidation. Another conductive layer (polysilicon, tungsten, or other conductive materals) is then conformally deposited to configure a vertical-current IGFET having surface diffusion 116 and buried diffusion 109 as source/drains, dielectric 106' as gate oxide, and 114 as gate. Thus, the structure shown provides a complete one-transistor DRAM cell.

Figure 2:
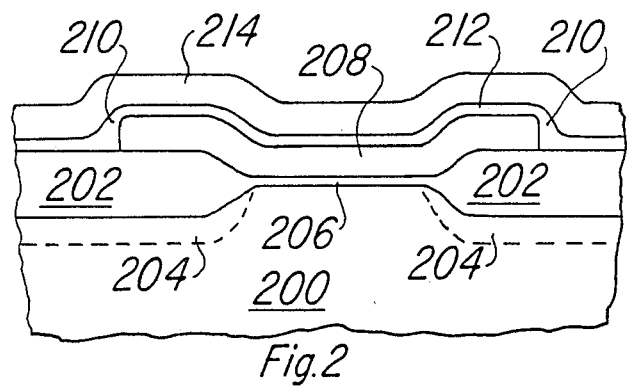
FIG. 2 shows a sample application of the present invention to passivating the sidewall of a floating-gate transistor.

FIG. 2 shows a sample embodiment of the present invention in the formation of a floating-gate memory cell, wherein a substrate 200 is implanted to form n+ bit lines 204, and is then oxidized (under conditions which produce thicker oxides on doped regions) and etched back slightly, to produce self-aligned thick oxides 202 centered over the bit lines 204. A gate oxide 206 is then grown on exposed silicon regions, and a first polysilicon layer is deposited, doped, and patterned to form floating gates 208. A silicon-rich oxide 210 is then conformally deposited and anisotropically etched, to leave filaments 210 around the edges of the floating gates 208. These filaments will passivate the sidewalls of the floating gates, and also improve the topography of overlying levels. Conventionally a thermal oxidation is used to passivate these sidewalls, but thermal oxidation here will also thicken the gate oxide under the edges of the floating gate, and will cause its edges to bend upward, which can lead to problems in subsequent processing. An interlevel dielectric 212 is then formed (e.g. by oxidation, nitride deposition, and reoxidation), and a second polysilicon layer is then deposited, doped, patterned and etched to define control gates 214. The step of etching the control gates 214 is preferably performed as a stack etch, so that, in all locations where second polysilicon layer 214 is etched away, any underlying portions of interlevel dielectric 212 and first polysilicon level 208 are also etched away. This means that the bare sidewall of floating gate 208 is exposed in some locations, and, again, this must be passivated. Some embodiments of the present invention teach that this is preferably done by deposition of a silicon-rich oxide, e.g. by chemical vapor deposition from a gas flow containing 50 sccm of dichlorosilane plus 40 sccm of nitrous oxide. Processing then continues with formation of peripheral devices, metallization, contact formation, and other conventional steps.

FIG. 3 shows a sample embodiment of the present invention in the formation of an insulated-gate transistor, wherein a gate 306 is capacitively coupled through dielectric 308 (preferably a silicon-rich oxide containing chlorine) to channel region 303 (which lies in p-type substrate 300 between a pair of n+ source/drain regions 302). Gate sidewall filaments 304 are preferably a silicon dioxide containing chlorine and an excess of silicon; by conformally depositing an oxide overall (e.g. from a gas flow containing 50 sccm of dichlorosilane plus 40 sccm of nitrous oxide) and then anisotropically plasma etching it back, the filaments 304 will be formed in a self-aligned fashion all along the edges of gate 306. By implanting the dopants to form the source/drains 302 after the filaments 304 have been formed, excess overlap of the source/drains 302 with the gate 306 can be avoided, and the self-aligned lateral spacing thus provided can also be used to configure doping structures which provide improved immunity to hot-electron effects.

Of course, the sample process described is not strictly limiting on the present invention. For example, the substrate temperature can be higher or lower than 800 C.; the most preferred range is 850-800 C., or (less preferably) as low as 700 C. or as high as 950 C. The limitations on temperature range are believed to be: if the temperature is too low, growth will proceed so slowly that it is uneconomic, or will stop altogether: if the temperature is too high, free-space nucleation may occur, which will lead to particulate formation and degradation of the film quality.

The total pressure can also be varied; while a total pressure in the range of 400-500 milliTorr is presently most preferred, pressures as high as 4000 milliTorr or as low as 150 milliTorr may also be within the scope of the invention. The limitation on this parameter comes from non-uniformity of deposition at very low pressures, and from gas phase nucleation at very high pressures.

Nitrous oxide is a substantially weaker oxidizer than $O_2$, and it is conceivable that other oxidizing species could be substituted while still preserving some of the advantages of the invention, but this is definitely not preferred.

Diluent gasses, such as $N_2$ or argon, could optionally be introduced into the gas flow, although this is not believed to be particularly advantageous. (It is noted that nitrogen is already present in the gas flow, since nitrogen is a by-product of the breakdown of nitrous oxide during the deposition reaction). In the presently preferred best mode, the furnace tube is preferably connected to a nitrogen flow while it is ramping up to temperature.

Chlorosilanes other than dichlorosilane could optionally be used as the silicon source in the gas flow. Silane is not suitable, since it is too unstable: but monochlorosilane has the advantage that lower deposition temperatures—well below 700 C.—can be used. Trichlorosilane and tetrachlorosilane are both possible candidates for substitution into the chemistry of the present invention, although these require higher deposition temperatures (since these species are more stable), so that some of the reduction in $\sqrt{Dt}$ (which is an advantage of the principally preferred embodiments) is lost.

Similarly, chlorosilanes which also contain other halogen species can (less preferably) be substituted, wholly or partially, for dichlorosilane. In general, the criterion is to provide a gaseous silicon source which is neither too stable (in which case excessively high growth temperatures may be required) not too unstable (in which case gas-phase nucleation may occur, leading to particulate formation). Fluorinated chlorosilanes will generally tend be more stable than the corresponding fully chlorinated species, and bromine substitution tends to lead to lower stability. Thus, candidate species include $SiH_3F$ and $SiHBrCl_2$ (although the vapor pressure of this species is rather low).

The present invention can also be practiced using limited reaction processing (i.e. transient heating rather than furnace heating), and in such embodiments the gas flows would preferably be reduced slightly from those given in the preferred embodiments described above.

The oxygen to silicon ratio does not have to be exactly 0.8, although this is the most preferred ratio; the key teaching of the present invention in this respect is that it should be less than one. The ratio should most preferably not be much less than 0.75, but could optionally (although much less preferably) be as large as 0.95.

As will be appreciated by those skilled in the art, the present invention can be widely modified and varied in the parameters just discussed and in many other ways as well, and its scope is not limited except as specified in the allowed claims.

What is claimed is:

1. A method for depositing a thin film of silicon oxides, comprising the steps of:
   (a) providing a substrate on which the thin film of oxides is to be deposited;
   (b) heating said substrate to a temperature in the range between 700° C. and 950° C.;
   (c) passing a gas flow over said substrate,
      said gas flow including a silicon bearing component and an oxidizing component,
      wherein the atomic ratio of silicon to oxygen in said gas flow is greater than one.

2. The method of claim 1, wherein said substrate is heated to a temperature in the range between 850° C. and 900° C. inclusive.

3. The method of claim 1, wherein said gas flow has a total pressure less than 1500 milliTorr.

4. The method of claim 1, wherein said gas flow has a total pressure in the range between 150 milliTorr and 1500 milliTorr inclusive.

5. The method of claim 1, wherein said oxidizing component consists essentially of nitrous oxide.

6. The method of claim 1, wherein said silicon bearing component consists essentially of one or more halated silanes.

7. The method of claim 1, wherein said silicon bearing component is selected from the group consisting of dichlorosilane and trichlorosilane.

8. The method of claim 1, wherein said silicon bearing component consists essentially of dichlorosilane.

9. The method of claim 1, wherein said substrate is heated in a furnace having a thermal gradient in the neighborhood of 10 degrees C. per meter.

10. The method of claim 1, wherein said silicon bearing component is flowed at a rate between 10 and 100 standard cubic centimeters per minute (sccm), and said oxidizing component is flowed at a rate which is smaller than the flow rate of said silicon bearing component.

11. A method for depositing a thin film of silicon oxides, comprising the steps of:
   (a) providing a substrate on which the thin film of oxides is to be deposited;
   (b) heating said substrate to a temperature in the range between 725° C. and 950° C. inclusive;
   (c) passing a gas flow over said substrate at a total pressure less than 1000 milliTorr,
      said gas flow including a silicon bearing component and an oxidizing component (said silicon bearing component consisting essentially of one or more chlorinated silanes),
      wherein the atomic ratio of available silicon atoms in said gas flow to available oxygen atoms in said gas flow is greater than one.

12. The method of claim 11, wherein said gas flow has a total pressure in the range between 150 milliTorr and 1000 milliTorr inclusive.

13. The method of claim 11, wherein said oxidizing component consists essentially of nitrous oxide.

14. The method of claim 11, wherein said oxidizing component consists essentially of nitrous oxide, and wherein said silicon bearing component is selected from the group consisting of monochlorosilane, dichlorosilane, trichlorosilane, and mixtures thereof.

15. The method of claim 11, wherein said silicon bearing component is selected from the group consisting of dichlorosilane and trichlorosilane.

16. The method of claim 11, wherein said silicon bearing component consists essentially of dichlorosilane, and said oxidizing component consists essentially of an oxide of nitrogen.

17. A method for depositing a thin film of silicon oxides, comprising the steps of:
   (a) providing a substrate on which the thin film of oxides is to be deposited:
   (b) heating said substrate to a temperature in the range between 700° C. and 900° C. inclusive;
   (c) passing a gas flow over said substrate at a total pressure less than 1000 milliTorr,
      said gas flow including a chlorosilane and nitrous oxide, said chlorosilane being selected from the group consisting of dichlorosilane, trichlorosilane, and mixtures thereof,
      wherein said chlorosilane is flowed at a greater volume than said nitrous oxide.

18. The method of claim 17, wherein said gas flow has a total pressure in the range between 150 milliTorr and 1500 milliTorr inclusive.

19. A method for fabricating trench capacitors, comprising the steps of:
   (a) providing a substrate having a semiconducting upper portion;
   (b) etching into said substrate a trench having a depth more than four times its width;
   (c) depositing an oxide on the sidewalls of said trench, said oxide being deposited by
      heating said substrate to a temperature between 700° C. and 950° C., and
      passing over said substrate at low pressure a gas mixture including halosilanes and an oxygen source, and including a larger atomic fraction of silicon than of oxygen;
   (d) and depositing a conductive material into said trench to define a capacitor plate which is insulated with respect to said substrate.

20. The method of claim 19, wherein said conductive material consists essentially of polycrystalline silicon.

21. The method of claim 19, wherein said substrate is an epitaxial structure, and the portion of said substrate next to the bottom of said trench is doped to a concentration of greater than $1E17$ cm$^{-3}$.

22. The method of claim 21, wherein said portion of said substrate next to the bottom of said trench is doped p-type.

* * * * *